(12) United States Patent
Liu et al.

(10) Patent No.: US 11,990,451 B2
(45) Date of Patent: May 21, 2024

(54) METHOD FOR PACKAGING SEMICONDUCTOR, SEMICONDUCTOR PACKAGE STRUCTURE, AND PACKAGE

(71) Applicant: CHANGXIN MEMORY TECHNOLOGIES, INC., Hefei (CN)

(72) Inventors: Jie Liu, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 399 days.

(21) Appl. No.: 17/372,530

(22) Filed: Jul. 12, 2021

(65) Prior Publication Data
US 2021/0335757 A1    Oct. 28, 2021

Related U.S. Application Data

(63) Continuation of application No. PCT/CN2020/096254, filed on Aug. 14, 2020.

(30) Foreign Application Priority Data

Oct. 16, 2019    (CN) .......................... 201910982076.1

(51) Int. Cl.
*H01L 23/00*    (2006.01)
*H01L 21/78*    (2006.01)
(Continued)

(52) U.S. Cl.
CPC .......... *H01L 25/0657* (2013.01); *H01L 21/78* (2013.01); *H01L 23/562* (2013.01);
(Continued)

(58) Field of Classification Search
CPC ... H01L 25/0657; H01L 21/78; H01L 23/562; H01L 25/50; H01L 2225/06513; H01L 2225/06541
See application file for complete search history.

(56) References Cited

U.S. PATENT DOCUMENTS 9,397,078 B1    7/2016   Chandolu et al.
10,832,993 B1 *  11/2020  Dadvand ................. H01L 24/05
(Continued)

FOREIGN PATENT DOCUMENTS

CN    101364550 A    2/2009
CN    101656248 A    2/2010
(Continued)

OTHER PUBLICATIONS

United States Patent and Trademark office, Non-final office action issued in related U.S. Appl. No. 17/372,537 on Jan. 3, 2024.

*Primary Examiner* — Thao P Le
(74) *Attorney, Agent, or Firm* — Kilpatrick Townsend & Stockton LLP (57) ABSTRACT

Embodiments provide a method for packaging a semiconductor, a semiconductor package structure, and a package. The packaging method includes: providing a substrate wafer having a first surface and a second surface arranged opposite to each other, the first surface having a plurality of grooves, a plurality of electrically conductive pillars being provided at a bottom of the groove, and the electrically conductive pillar penetrating through the bottom of the groove to the second surface; providing a plurality of semiconductor die stacks; placing the semiconductor die stack in the groove; and filling an insulating dielectric in a gap between a sidewall of the groove and the semiconductor die stack to form an insulating dielectric layer covering an upper surface of the semiconductor die stack to seal up the semiconductor die stack so as to form the semiconductor package structure.

20 Claims, 6 Drawing Sheets

(51) Int. Cl.
*H01L 25/00* (2006.01)
*H01L 25/065* (2023.01)

(52) U.S. Cl.
CPC .... *H01L 25/50* (2013.01); *H01L 2225/06513* (2013.01); *H01L 2225/06541* (2013.01); *H01L 2225/06548* (2013.01); *H01L 2225/06586* (2013.01)

(56) References Cited

U.S. PATENT DOCUMENTS

| | | | |
|---|---|---|---|
| 10,985,101 B2 * | 4/2021 | Lai | ................... H01L 23/5226 |
| 2009/0085224 A1 | 4/2009 | Choi et al. | |
| 2009/0283899 A1 | 11/2009 | Yoon et al. | |
| 2015/0262928 A1 | 9/2015 | Shen et al. | |
| 2016/0013151 A1 | 1/2016 | Shen et al. | |
| 2016/0233110 A1 | 8/2016 | Zhou et al. | |
| 2017/0040185 A1 | 2/2017 | Fuwa | |
| 2017/0317019 A1 | 11/2017 | Shen et al. | |
| 2020/0075546 A1 * | 3/2020 | Shih | ................... H01L 25/50 |
| 2020/0083225 A1 * | 3/2020 | Ma | ................... H01L 23/528 |
| 2020/0251454 A1 * | 8/2020 | Shih | ................... H01L 21/4857 |
| 2021/0066317 A1 * | 3/2021 | Wu | ................... H10B 43/35 |
| 2021/0082873 A1 * | 3/2021 | Chen | ................... H01L 23/522 |

FOREIGN PATENT DOCUMENTS

| | | |
|---|---|---|
| CN | 102456674 A | 5/2012 |
| CN | 103718289 B | 2/2017 |
| CN | 107408546 A | 11/2017 |
| CN | 108630625 A | 10/2018 |
| CN | 210272258 U | 4/2020 |
| CN | 210607189 U | 5/2020 |

* cited by examiner

METHOD FOR PACKAGING SEMICONDUCTOR, SEMICONDUCTOR PACKAGE STRUCTURE, AND PACKAGE

CROSS-REFERENCE TO RELATED APPLICATION

This application is a continuation of PCT/CN2020/096254, filed on Aug. 14, 2020, which claims priority to Chinese Patent Application No. 201910982076.1, titled "METHOD FOR PACKAGING SEMICONDUCTOR, SEMICONDUCTOR PACKAGE STRUCTURE, AND PACKAGE" and filed on Oct. 16, 2019, the entire contents of which are incorporated herein by reference.

FIELD OF THE INVENTION

The present disclosure relates to the field of semiconductor package, and more particularly, to a method for packaging a semiconductor, a semiconductor package structure, and a package.

BACKGROUND OF THE INVENTION

Also known as a 3D or three-dimensional packaging technology, a stacked packaging technology is one of current mainstream multi-chip packaging technologies, which can stack at least two semiconductor chips (also referred to as dies, i.e., blocks having full functions diced from a wafer). The stacked packaging technology is generally employed to manufacture electronic components such as memory chips, logic chips, and processor chips. With the development of the electronics industry, the electronic components are required for high capacity, high function, high speed and small size. To meet the above requirements, it is necessary to incorporate more chips in a single package, which may increase a package height of the electronic components. Furthermore, when a semiconductor package structure moves or vibrates, there may likely exist slight translocation between the chips, which results in poor reliability of a package structure and has a negative effect on the performance of the package structure.

Therefore, how to reduce the package height of the package and improve the reliability of the package has become a technical problem urgently needing to be solved at present.

SUMMARY OF THE INVENTION

A technical problem to be solved by the present disclosure is to provide a method for packaging a semiconductor, a semiconductor package structure, and a package. The present disclosure is characterized by a lower package height, a higher reliability, and a lower warpage.

To solve the above problem, the present disclosure provides a method for packaging a semiconductor. The method includes followings steps. There is provided a substrate wafer, which has a first surface and a second surface arranged opposite to each other. The first surface has a plurality of grooves, a plurality of electrically conductive pillars is provided at a bottom of the groove, and the electrically conductive pillar penetrates through the bottom of the groove to the second surface. A plurality of semiconductor die stacks is provided and placed in the groove. An upper surface of the semiconductor die stack is lower than or flush with an upper edge of the groove, and a bottom of the semiconductor die stack is electrically connected to the electrically conductive pillar. An insulating dielectric is filled in a gap between a sidewall of the groove and the semiconductor die stack to form an insulating dielectric layer covering an upper surface of the semiconductor die stack to seal up the semiconductor die stack so as to form a semiconductor package structure.

Further, the second surface of the substrate wafer has a plurality of electrically conductive blocks electrically connected to the electrically conductive pillars.

Further, the method of forming a groove on the substrate wafer includes: planarizing the first surface of the substrate wafer; and removing a part of the substrate wafer from the first surface until the electrically conductive pillar is exposed to form the groove.

Further, the substrate wafer has a dicing lane, and the dicing lane serves as an alignment mark for forming the groove.

Further, each of the plurality of semiconductor die stacks is formed by stacking a plurality of semiconductor dies electrically connected to each other, and the bottom of the semiconductor die stack is electrically connected to the electrically conductive pillar through the semiconductor die.

Further, the semiconductor dies are electrically connected to each other through the electrically conductive pillar penetrating through each of the semiconductor dies and the electrically conductive block between the adjacent semiconductor dies.

Further, the bottom of the semiconductor die stack is electrically connected to the electrically conductive pillar penetrating through the bottom of the groove through the electrically conductive block.

Further, a thermal expansion coefficient of the substrate wafer is greater than or equal to that of the insulating dielectric layer.

Further, the substrate wafer is a silicon wafer, and the insulating dielectric layer is a silicon dioxide insulating dielectric layer.

Further, the method for packaging a semiconductor also includes: covering an upper surface of the insulating dielectric layer and the first surface of the substrate wafer with a cover plate wafer.

Further, a surface of the cover plate wafer facing toward the substrate wafer has a plurality of electrically conductive pillars, and the electrically conductive pillar is electrically connected to the upper surface of the semiconductor die stack through an electrically conductive structure in the insulating dielectric layer.

Further, after the step of sealing up the semiconductor die stack, the method also includes a dicing step: dicing the semiconductor package structure along the gap between the grooves to form a plurality of packages independent of each other.

The present disclosure also provides a semiconductor package structure, which includes a substrate wafer having a first surface and a second surface arranged opposite to each other. The first surface has a plurality of grooves, a plurality of electrically conductive pillars is provided at a bottom of the groove, and the electrically conductive pillar penetrates through the bottom of the groove to the second surface. Moreover, the semiconductor package structure includes a plurality of semiconductor die stacks placed in the groove, wherein an upper surface of the semiconductor die stack is lower than or flush with an upper edge of the groove, and a bottom of the semiconductor die stack is electrically connected to the electrically conductive pillar. Furthermore, the semiconductor package structure also includes an insulating dielectric layer filling a gap between a sidewall of the groove and the semiconductor die stack and covering an upper surface of the semiconductor die stack to seal up the semiconductor die stack.

Further, the second surface of the substrate wafer has a plurality of electrically conductive blocks, and the electrically conductive blocks are electrically connected to the electrically conductive pillars.

Further, each of the plurality of semiconductor die stacks is formed by stacking a plurality of semiconductor dies electrically connected to each other, and the semiconductor dies are electrically connected to the electrically conductive pillars through the bottom of the semiconductor die stack.

Further, the semiconductor dies are electrically connected to each other through the electrically conductive pillar penetrating through each of the semiconductor dies and the electrically conductive block between the adjacent semiconductor dies.

Further, the bottom of the semiconductor die stack is electrically connected to the electrically conductive pillar penetrating through the bottom of the groove through the electrically conductive block.

Further, a thermal expansion coefficient of the substrate wafer is greater than or equal to that of the insulating dielectric layer.

Further, the substrate wafer is a silicon wafer, and the insulating dielectric layer is a silicon dioxide insulating dielectric layer.

Further, an upper surface of the insulating dielectric layer and the first surface of the substrate wafer are covered with a cover plate wafer.

Further, a surface of the cover plate wafer facing toward the substrate wafer has a plurality of electrically conductive pillars, in the insulating dielectric layer there is provided with an electrically conductive structure, and the electrically conductive pillar is electrically connected to the upper surface of the semiconductor die stack through the electrically conductive structure.

The present disclosure also provides a package, which includes a substrate having a first surface and a second surface arranged opposite to each other. The first surface has at least one groove, a plurality of electrically conductive pillars is provided at a bottom of the groove, and the electrically conductive pillar penetrates through the bottom of the groove to the second surface. Moreover, the package includes at least one semiconductor die stack placed in the groove, wherein an upper surface of the semiconductor die stack is lower than or flush with an upper edge of the groove, and a bottom of the semiconductor die stack is electrically connected to the electrically conductive pillar. Furthermore, the package also includes an insulating dielectric layer filling a gap between a sidewall of the groove and the semiconductor die stack and covering an upper surface of the semiconductor die stack to seal up the semiconductor die stack.

Advantages of the present disclosure are as below. A groove is formed on the substrate wafer to accommodate the semiconductor die stack, and is sealed up by an insulating dielectric layer. The height of the semiconductor package structure can be greatly reduced while the same number of semiconductor dies are packaged, such that ultra-thin packaging can be achieved. In addition, the insulating dielectric layer fills the gap between the sidewall of the groove and the semiconductor die stack, and the insulating dielectric layer can fix the semiconductor die stack, such that translocation between the semiconductor dies may be prevented even though the semiconductor package structure moves or vibrates, thereby preventing a poor connection between the semiconductor dies and a poor connection between the semiconductor die stack and the substrate wafer. In this way, the stability of the semiconductor die stack is improved, and the reliability of the semiconductor package structure is improved.

DETAILED DESCRIPTION OF THE EMBODIMENTS

Embodiments of a method for packaging a semiconductor, a semiconductor package structure and a package provided by the present disclosure are described below in detail with reference to the accompanying drawings.

Figure 1:
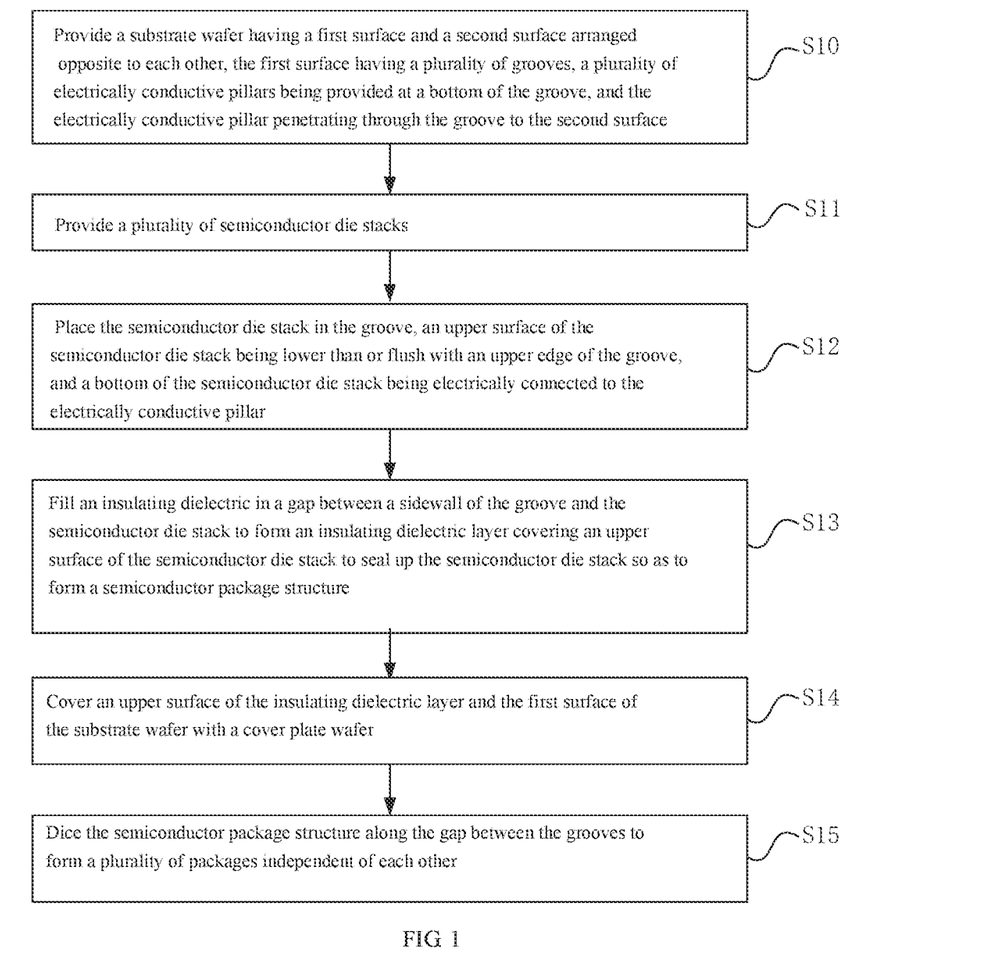
FIG. 1 is a schematic diagram showing steps of a method for packaging a semiconductor according to an embodiment of the present disclosure.

FIG. 1 is a schematic diagram showing steps of the method for packaging a semiconductor according to an embodiment of the present disclosure. Referring to FIG. 1, the method for packaging a semiconductor includes following steps. In Step S10, a substrate wafer is provided, and the substrate wafer has a first surface and a second surface arranged opposite to each other, wherein the first surface has a plurality of grooves, a plurality of electrically conductive pillars is provided at a bottom of the groove, and the electrically conductive pillar penetrates through the bottom of the groove to the second surface. In Step S11, a plurality of semiconductor die stacks is provided. In Step S12, the semiconductor die stack is placed in the groove, wherein an upper surface of the semiconductor die stack is lower than or flush with an upper edge of the groove, and a bottom of the semiconductor die stack is electrically connected to the electrically conductive pillar. In Step S13, an insulating dielectric is filled in a gap between a sidewall of the groove and the semiconductor die stack to form an insulating dielectric layer covering an upper surface of the semiconductor die stack to seal up the semiconductor die stack so as to form a semiconductor package structure. In Step S14, an upper surface of the insulating dielectric layer and the first surface of the substrate wafer are covered with a cover plate wafer. In Step S15, the semiconductor package structure is diced along the gap between the grooves to form a plurality of packages independent of each other.

FIG. 2A-FIG. 2H are schematic flow diagrams of the method for packaging a semiconductor according to an embodiment of the present disclosure.

Figure 2A:
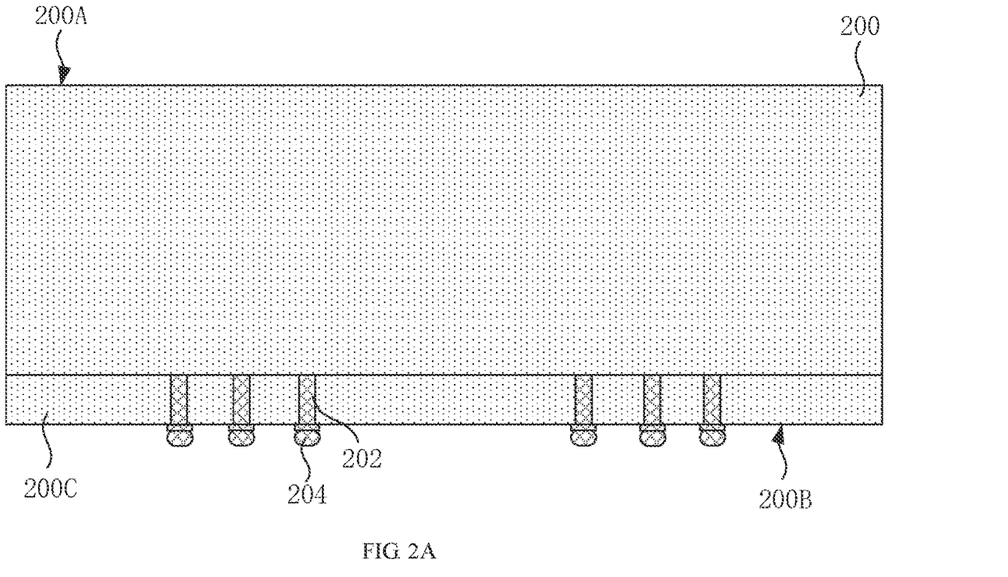
FIG. 2A-FIG. 2H are schematic flow diagrams of the method for packaging a semiconductor according to an embodiment of the present disclosure.
Figure 2B:
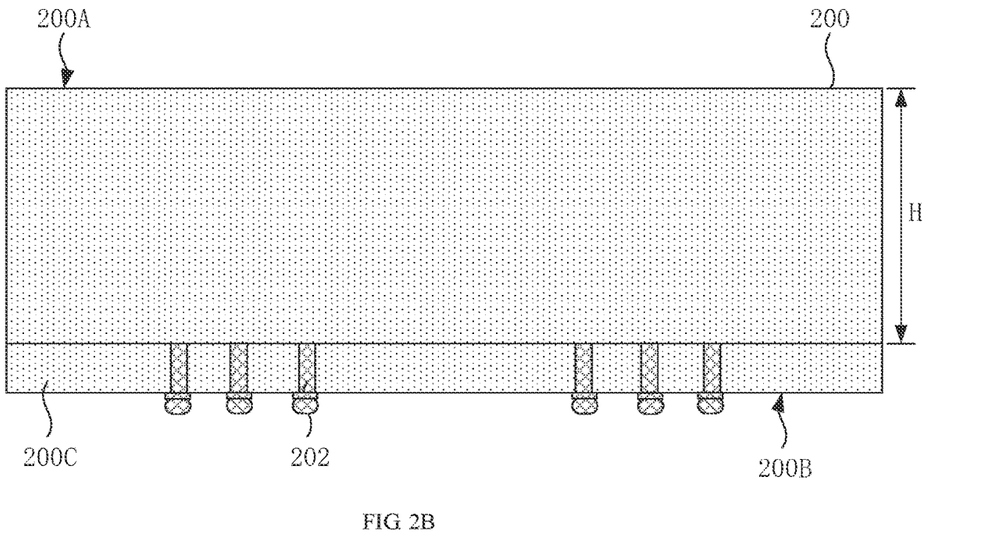
Figure 2C:
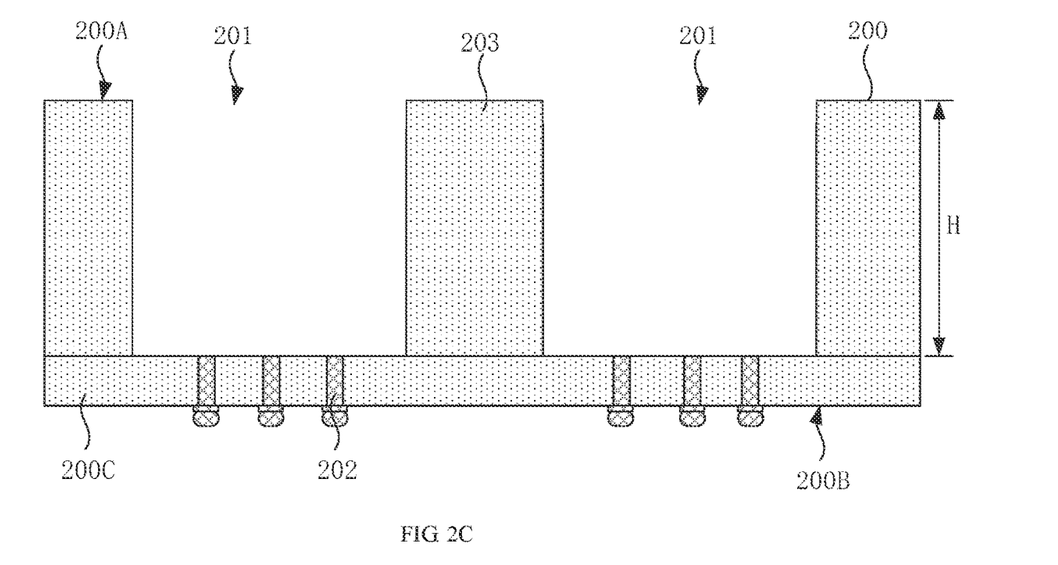

Referring to Step S10 and FIG. 2C, there is provided a substrate wafer 200, which has a first surface 200A and a second surface 200B arranged opposite to each other. The first surface 200A has a plurality of grooves 201, a plurality of electrically conductive pillars 202 is provided at a bottom of the groove 201, and the electrically conductive pillar 202 penetrates through the bottom of the groove 201 to the second surface 200B.

An embodiment of forming the groove 201 is described below by way of illustration.

Referring to FIG. 2A, the substrate wafer 200 has a first surface 200A and a second surface 200B arranged opposite to each other. The first surface 200A is a back surface of the substrate wafer 200, and the second surface 200B is a front surface of the substrate wafer 200. That is, on the second surface 200B, the substrate wafer 200 has a functional layer 200C. The electrically conductive pillar 202 extends from the second surface 200B into the substrate wafer 200, and the surface of the electrically conductive pillar 202 is exposed to the second surface 200B. The electrically conductive pillar 202 not only can play a role of conducting electricity, but also can play a role of conducting heat.

Referring to FIG. 2B, the first surface 200A of the substrate wafer 200 is planarized to facilitate subsequent processes. Further, the first surface 200A of the substrate wafer 200 may be planarized by using a chemical mechanical polishing method. In this step, a thickness of the substrate wafer 200 is reduced. It is to be noted that after this step is performed, a distance H from the first surface 200A of the substrate wafer 200 to the functional layer 200C of the second surface 200B is greater than or equal to a height of the semiconductor die stack 210 to provide sufficient operation space for the subsequent processes, and a width of the groove 201 needs to be greater than or equal to that of the semiconductor die stack 210. In one embodiment, the width of the groove 201 is slightly larger than that of the semiconductor die stack 210, such that the semiconductor die stack 210 is placed in the groove 201.

Referring to FIG. 2C, a part of the substrate wafer 200 is removed from the first surface 200A until the electrically conductive pillar 202 is exposed to form the groove 201. In this step, a photolithography and etching process may be employed to remove a part of the substrate wafer 200, and the etching is not stopped until the electrically conductive pillar 202 is exposed at the bottom of the groove 201. Further, when the etching is about to be stopped, etching conditions may be adjusted to ensure that an edge etching rate of the groove 201 is smaller than an etching rate of a middle part of the groove 201, such that a bottom corner of the groove 201 is shaped like an arc, which can enhance the stability of the sidewall of the groove 201.

Further, in this step, the substrate wafer 200 has a dicing lane 203. As shown in FIG. 2C, the groove 201 is formed when the dicing lane 203 passes through the gap between two adjacent grooves 201. The dicing lane 203 may serve as an alignment mark for forming the groove 201. In this way, the accuracy of forming the groove 201 is improved, and there is no need to make additional alignment marks, such that process steps are saved, and production efficiency is improved.

The above embodiment is an embodiment of forming the groove 201 on the first surface 200A of the substrate wafer 200. In other embodiments of the present disclosure, other methods may also be employed to form the groove 201 on the first surface 200A of the substrate wafer 200.

In this embodiment, the width of the dicing lane 203 is equal to the distance between two grooves 201. In other embodiments of the present disclosure, the groove 201 may occupy a part of space of the dicing lane 203, such that the distance between the two adjacent grooves 201 is smaller than the width of the dicing lane 203, which makes it easier to place the semiconductor die stack 210 into the groove 201 subsequently. Furthermore, a side surface of the semiconductor die stack 210 can be prevented from touching the sidewall of the groove 201 to avoid having a negative effect on the performance of the semiconductor die stack 210.

Further, with continued reference to FIG. 2A, a plurality of electrically conductive blocks 204 is provided on the second surface 200B of the substrate wafer 200, and the electrically conductive blocks 204 are electrically connected to the electrically conductive pillars 202 to electrically connect the electrically conductive pillars 202 to external devices such as printed circuit boards. The electrically conductive block 204 may be formed on the second surface 200B of the substrate wafer 200 before the groove 201 is formed.

Figure 2D:
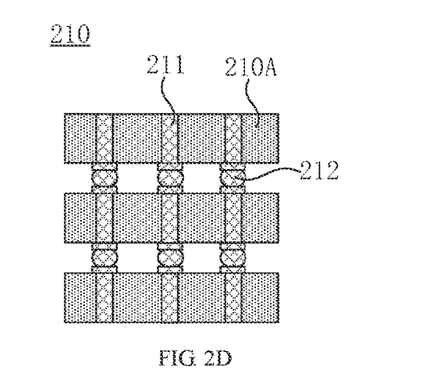

Referring to Step S11 and FIG. 2D, a plurality of semiconductor die stacks 210 is provided. The number of the semiconductor die stacks 210 may be equal to that of the grooves 201, or the number of the semiconductor die stacks 210 may be more than that of the grooves 201. In one embodiment, if the number of the semiconductor die stacks 210 is equal to that of the grooves 201, in the subsequent processes, one semiconductor die stack 210 is placed in one groove 201. If the number of the semiconductor die stacks 210 is more than that of the grooves 201, two or more semiconductor die stacks 210 may be placed in parallel in one groove 201.

The semiconductor die stack 210 is formed by stacking a plurality of semiconductor dies 210A. In this embodiment, three semiconductor dies 210A are schematically shown. The three semiconductor dies 210A are sequentially stacked to form the semiconductor die stack 210. In the semiconductor die stack 210, the semiconductor dies 210A are electrically connected to each other, such that an electrical signal of the semiconductor die 210A can be transmitted to an external structure. In this embodiment, the semiconductor dies 210A are electrically connected to each other through the electrically conductive pillar 211 penetrating through each of the semiconductor dies and the electrically conductive block 212 between the adjacent semiconductor dies. Each of the semiconductor dies 210A has an electrically conductive pillar 211 penetrating through the semiconductor die 210A, and the electrically conductive pillars 211 of the two semiconductor dies 210A are electrically connected by the electrically conductive block 212 arranged therebetween. The method of forming the electrically conductive pillar on the semiconductor die 210A includes but is not limited to a through silicon via (TSV) process well known in the art.

After this step is completed, a surface of the electrically conductive pillar is exposed at the bottom of the semiconductor die stack 210, and the surface of the electrically conductive pillar is also exposed on the top of the semiconductor die stack 210.

Figure 2E:
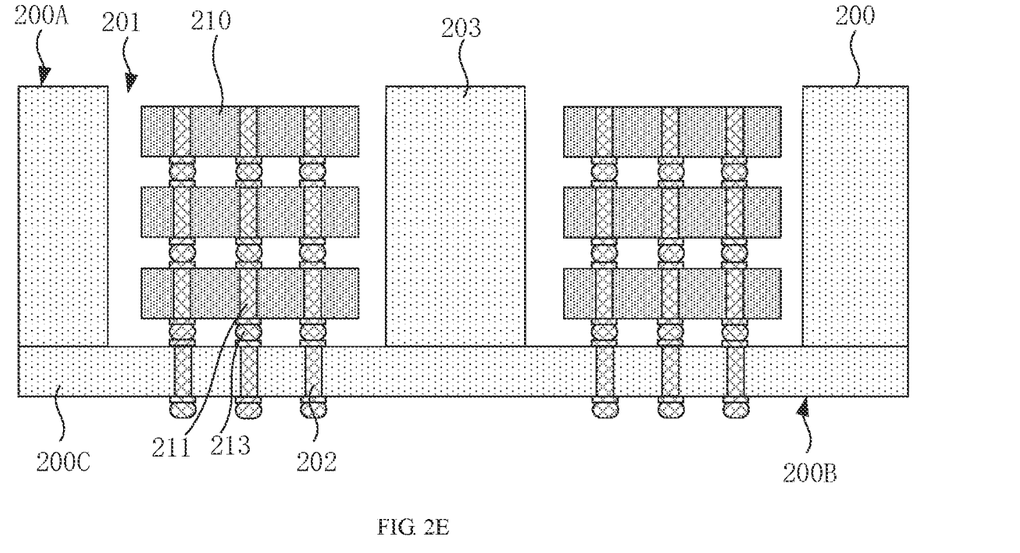

With reference to Step S12 and FIG. 2E, the semiconductor die stack 210 is placed in the groove 201. In this step, one or more semiconductor die stacks 210 may be placed in one of the grooves 201. In this embodiment, one semiconductor die stack 210 is placed in one groove 201.

The bottom of the semiconductor die stack 210 is electrically connected to the electrically conductive pillar 202 penetrating through the bottom of the groove 201. That is, the electrically conductive pillar 211 exposed at the bottom of the semiconductor die stack 210 is electrically connected to the electrically conductive pillar 202 exposed at the bottom of the groove 201. In one embodiment, the electrically conductive pillar 211 and the electrically conductive pillar 202 may be electrically connected through the electrically conductive block 213.

The upper surface of the semiconductor die stack 210 is lower than or flush with the upper edge of the groove 201 to facilitate subsequent processes. In this embodiment, the upper surface of the semiconductor die stack 210 is lower than the upper edge of the groove 201. In addition, to make it easier to place the semiconductor die stack 210 into the groove 201, the width of the groove 201 is greater than or equal to that of the semiconductor die stack 210. In this case, after the semiconductor die stack 210 is placed in the groove 201, there is a gap between the side surface of the semiconductor die stack 210 and the sidewall of the groove 201.

Figure 2F:
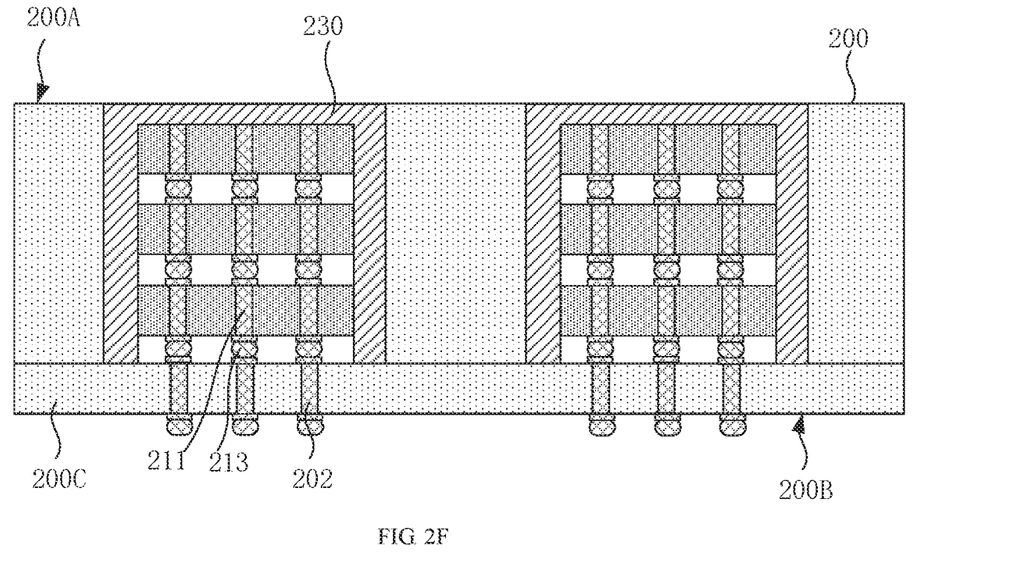

With reference to Step S13 and FIG. 2F, an insulating dielectric is filled in a gap between the sidewall of the groove 210 and the semiconductor die stack 210 to form an insulating dielectric layer 230, and the insulating dielectric layer 230 covers an upper surface of the semiconductor die stack 210 to seal up the semiconductor die stack 210. In this way, the semiconductor package structure is formed.

After this step is performed, the groove 201 is filled with the insulating dielectric layer 230, the semiconductor die stack 210 is sealed up, the plurality of semiconductor dies 210A of the semiconductor die stack 210 is fixed to each other, and the semiconductor die stack 210 is fixed with respect to the substrate wafer, such that translocation between the semiconductor dies and between the semiconductor die stack and the substrate wafer may be prevented even though the semiconductor package structure moves or vibrates, thereby preventing a poor connection between the semiconductor dies and a poor connection between the semiconductor die stack and the substrate wafer. In this way, the stability of the semiconductor die stack is improved, and the reliability of the semiconductor package structure is improved.

Furthermore, according to the method for packaging a semiconductor provided by the present disclosure, a groove is formed on the substrate wafer to accommodate the semiconductor die stack, and the semiconductor die stack is sealed up by an insulating dielectric layer. In this way, the height of the semiconductor package structure can be greatly reduced while the same number of semiconductor dies are packaged, such that ultra-thin packaging can be achieved.

In one embodiment, the thermal expansion coefficient of the substrate wafer 200 is greater than or equal to that of the insulating dielectric layer 230. The advantages of the present disclosure are as below. When the semiconductor package structure is heated, the deformation of the insulating dielectric layer 230 is less than that of the substrate wafer 200, such that the substrate wafer 200 may be prevented from being forcedly deform, such that it is avoidable to have adverse effects on the reliability and warpage of the semiconductor package structure. Of course, the thermal expansion coefficient of the substrate wafer 200 is not allowed to differ too much from the thermal expansion coefficient of the insulating dielectric layer 230, otherwise the insulating dielectric layer 230 may likely be divorced from the sidewall of the groove 201 of the substrate wafer 200. In this embodiment, the substrate wafer 200 is a silicon wafer, and the insulating dielectric layer 230 is a silicon dioxide insulating dielectric layer.

Alternatively, the method for packaging a semiconductor also includes following steps. With reference to Step S14 and FIG. 2G an upper surface of the insulating dielectric layer 230 and the first surface of the substrate wafer 200 are covered with a cover plate wafer 220 to further seal up the semiconductor die stack 210. The cover plate wafer 220 and the substrate wafer 200 may be combined by a bonding process.

Figure 2G:
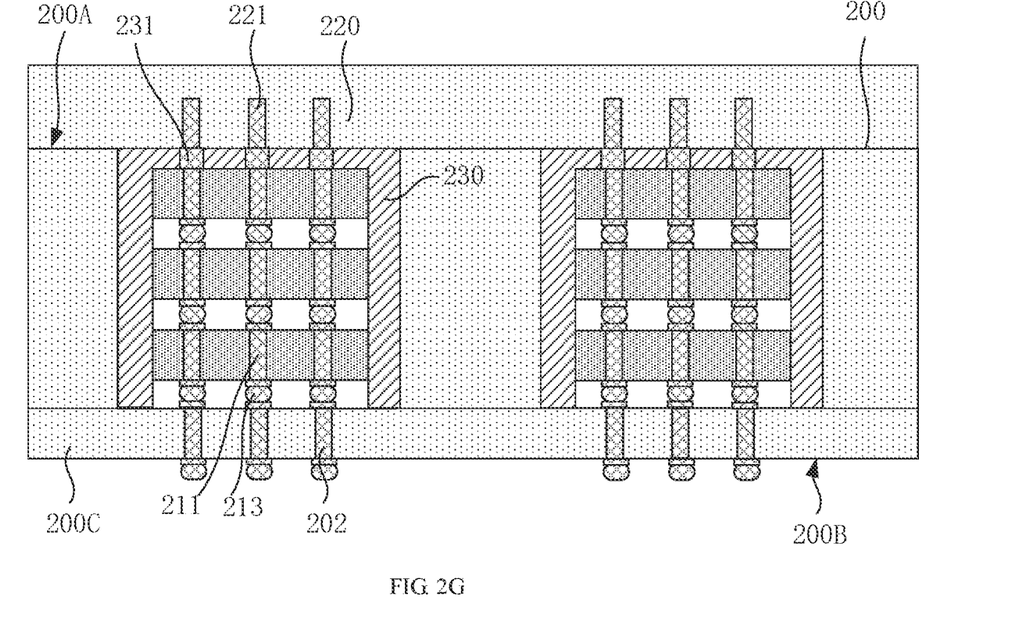
Figure 2H:
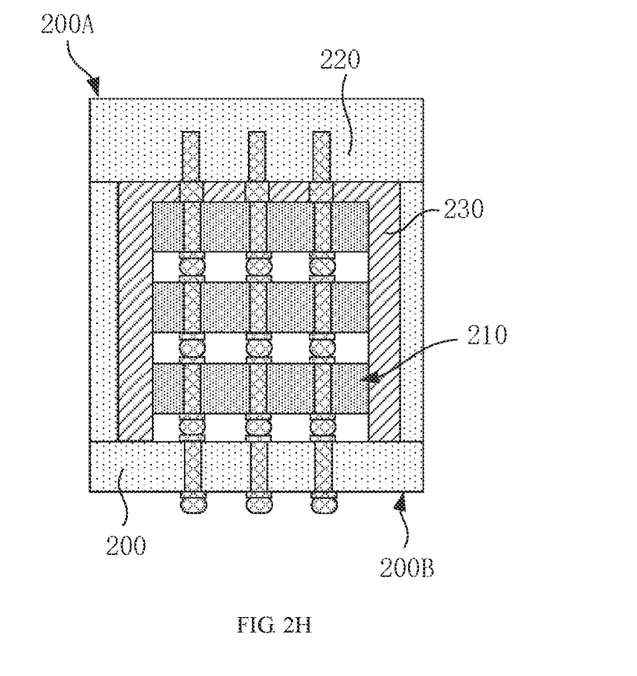

Further, a surface of the cover plate wafer 220 facing toward the substrate wafer 200 has a plurality of electrically conductive pillars 221, and in the insulating dielectric layer 230 there is also provided with an electrically conductive pillar 231. In this case, the electrically conductive pillar 221 in the cover plate wafer 220 may be electrically connected to the upper surface of the semiconductor die stack 210 through the electrically conductive pillar 231 in the insulating dielectric layer 230. That is, the electrically conductive pillar 221 on the surface of the cover plate wafer 220 is electrically connected to the electrically conductive pillar 211 exposed on the upper surface of the semiconductor die stack 210. The cover plate wafer 220 may provide heat conduction to the semiconductor die stack 210 through the electrically conductive pillar 221, and may further fix the semiconductor die stack 210. In addition, in semiconductor packaging, other wafers may be stacked on the cover plate wafer 220, and the electrically conductive pillar 221 may function as electrical connection. The step of arranging the electrically conductive pillar 231 in the insulating dielectric layer 230 may be performed before the step of covering the cover plate wafer 220.

Alternatively, after Step S13 or Step S14 is performed, the present disclosure also includes a dicing step. In this embodiment, after Step S14 is performed, the present disclosure also includes a dicing step. With reference to Step S15 and FIG. 2H, the semiconductor package structure is diced along the gap between the grooves 201 to form a plurality of packages independent of each other. In one embodiment, the semiconductor package structure is diced along the dicing lane 203 between the grooves 201 to form a plurality of packages independent of each other. The dicing method includes but is not limited to mechanical dicing, laser dicing and the like.

Figure 3:
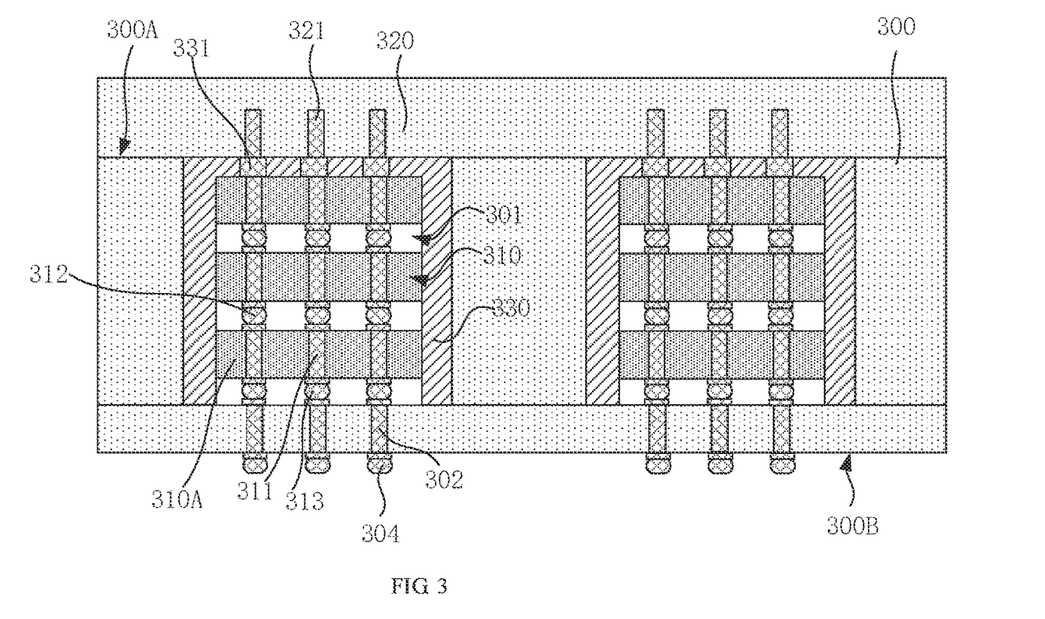
FIG. 3 is a schematic structural diagram of a semiconductor package structure according to an embodiment of the present disclosure.

The present disclosure also provides a semiconductor package structure formed by using the above-mentioned method for packaging a semiconductor. FIG. 3 is a schematic structural diagram of the semiconductor package structure according to an embodiment of the present disclosure. With reference to FIG. 3, the semiconductor package structure includes a substrate wafer 300, a plurality of semiconductor die stacks 310, an insulating dielectric layer 330, and a cover plate wafer 320.

The substrate wafer 300 has a first surface 300A and a second surface 300B arranged opposite to each other. The first surface 300A has a plurality of grooves 301, a plurality of electrically conductive pillars 302 is provided at a bottom of the groove 301, and the electrically conductive pillar 302 penetrates through the bottom of the groove 301 to the second surface 300B. The second surface 300B of the substrate wafer 300 has a plurality of electrically conductive blocks 304 electrically connected to the electrically conductive pillars 302.

The semiconductor die stack 310 is placed in the groove 301, and an upper surface of the semiconductor die stack 310 is lower than or flush with an upper edge of the groove 301. In this embodiment, the upper surface of the semiconductor die stack 310 is lower than the upper edge of the groove 301. A bottom of the semiconductor die stack 310 is electrically connected to the electrically conductive pillar 302. The semiconductor die stack 310 is formed by stacking a plurality of semiconductor dies 310A, the semiconductor dies 310A may be electrically connected to each other through the electrically conductive pillar 311 penetrating through each of the semiconductor dies 310A and the electrically conductive block 312 between the adjacent semiconductor dies 310A, and may be electrically connected to the electrically conductive pillar 302 through the bottom of the semiconductor die stack 310. The bottom of the semiconductor die stack 310 may be electrically connected to the electrically conductive pillar 302 through the electrically conductive block 313.

The insulating dielectric layer 330 is filled in the gap between the sidewall of the groove 330 and the semiconductor die stack 310, and the insulating dielectric layer 330 is covered on the upper surface of the semiconductor die stack 310 to seal up the semiconductor die stack 310. The thermal expansion coefficient of the substrate wafer 300 is greater than or equal to that of the insulating dielectric layer 330. The advantages of the present disclosure are as below. When the semiconductor package structure is heated, the deformation of the insulating dielectric layer 330 is less than that of the substrate wafer 300, such that the substrate wafer 300 may be prevented from being forcedly deform, and thus it is avoidable to have adverse effects on the reliability and warpage of the semiconductor package structure. Of course, the thermal expansion coefficient of the substrate wafer 300 is not allowed to differ too much from the thermal expansion coefficient of the insulating dielectric layer 330, otherwise the insulating dielectric layer 330 may likely be divorced from the sidewall of the groove 301 of the substrate wafer 300. In this embodiment, the substrate wafer 300 is a silicon wafer, and the insulating dielectric layer 330 is a silicon dioxide insulating dielectric layer.

As an alternative structure, the cover plate wafer 320 is covered on the insulating dielectric layer 330 and the first surface 300A of the substrate wafer 300 to seal up the semiconductor die stack 310. Further, the surface of the cover plate wafer 320 facing toward the substrate wafer 300 has a plurality of electrically conductive pillars 321, in the insulating dielectric layer 330 there is also provided with an electrically conductive pillar 331, and the electrically conductive pillar 321 of the cover plate wafer 320 is electrically connected to the upper surface of the semiconductor die stack 310 through the electrically conductive pillar 331 in the insulating dielectric layer 330. In one embodiment, the electrically conductive pillar 321 is electrically connected to the electrically conductive pillar 311 exposed on the upper surface of the semiconductor die stack 310. The cover plate wafer 300 can provide heat conduction to the semiconductor die stack 310 through the electrically conductive pillar 321 and can further fix the semiconductor die stack 310. In addition, in the semiconductor packaging, other wafers may also be stacked on the cover plate wafer 300, and the electrically conductive pillar 321 may function as electrical connection.

In the semiconductor package structure provided by the present disclosure, a groove is formed on the substrate wafer to accommodate the semiconductor die stack, and the semiconductor die stack is sealed up by an insulating dielectric layer. In this way, the height of the semiconductor package structure can be greatly reduced, such that ultra-thin packaging can be achieved. In addition, the insulating dielectric layer is filled in the gap between the sidewall of the groove and the semiconductor die stack, and the insulating dielectric layer can fix the semiconductor die stack, such that translocation between the semiconductor dies and translocation between the semiconductor die stack and the substrate may be prevented even though the semiconductor die stack moves or vibrates, thereby preventing a poor connection between the semiconductor dies and a poor connection between the semiconductor die stack and the substrate wafer. In this way, the stability of the semiconductor die stack is improved, and the reliability of the semiconductor package structure is improved.

Figure 4:
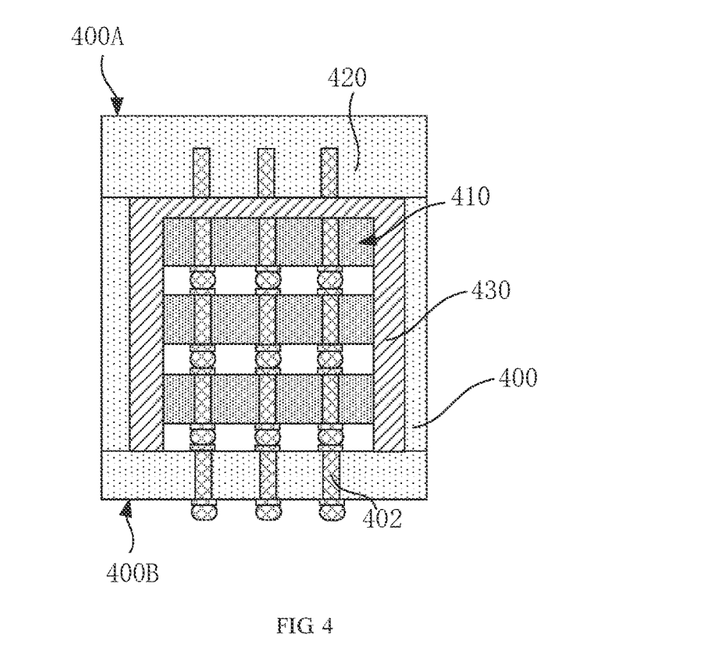
FIG. 4 is a schematic structural diagram of a package according to an embodiment of the present disclosure.

The present disclosure also provides a package. FIG. 4 is a schematic structural diagram of the package according to an embodiment of the present disclosure. With reference to FIG. 4, the package is formed by dicing the above-mentioned semiconductor package structure along the dicing lane between the grooves. The package includes a substrate 400, at least one semiconductor die stack 410, an insulating dielectric layer 430, and a cover plate 420.

The substrate 400 has a first surface 400A and a second surface 400B arranged opposite to each other. The first surface 400A has at least one groove 401, a plurality of electrically conductive pillars 402 is provided at a bottom of the groove 401, and the electrically conductive pillar 402 penetrates through the bottom of the groove 401 to the second surface 400B.

The semiconductor die stack 410 is placed in the groove 401, an upper surface of the semiconductor die stack 410 is lower than or flush with an upper edge of the groove 401, and a bottom of the semiconductor die stack 410 is electrically connected to the electrically conductive pillar 402.

The insulating dielectric layer 430 is filled in the gap between the sidewall of the groove 430 and the semiconductor die stack 410, and the insulating dielectric layer 330 is covered on the upper surface of the semiconductor die stack 410 to seal up the semiconductor die stack 410.

As an alternative structure, the cover plate 420 is covered on the upper surface of the insulating dielectric layer 430 and the first surface 400A of the substrate 400 to further seal up the semiconductor die stack 410.

The package of the present disclosure has a lower package height, and thus ultra-thin packaging is realized. Furthermore, translocation between the semiconductor dies and translocation between the semiconductor die stack and the substrate may be prevented even though the package moves or vibrates. Thus, a poor connection between the semiconductor dies and a poor connection between the semiconductor die stack and the substrate wafer may be prevented. In this way, the stability of the semiconductor die stack is improved, and the reliability of the package is improved.

What is claimed is:

1. A method for packaging a semiconductor, comprising:
   providing a substrate wafer, the substrate wafer having a first surface and a second surface arranged opposite to each other, the first surface having a plurality of grooves, wherein a plurality of electrically conductive pillars are provided at a bottom of a given one of the plurality of grooves, and the plurality of electrically conductive pillars penetrate through the bottom of the given groove to the second surface of the substrate wafer;
   providing a plurality of semiconductor die stacks in the plurality of grooves such that a given one of the plurality of semiconductor die stacks is provided in a corresponding one of the plurality of grooves, wherein an upper surface of the given semiconductor die stack is lower than or flush with an upper edge of the corresponding groove, and a bottom of the given semiconductor die stack is electrically connected to the plurality of electrically conductive pillars provided at the bottom of the corresponding groove; and
   filling an insulating dielectric in gaps among sidewalls of the plurality of grooves and the plurality of semiconductor die stacks to form an insulating dielectric layer, the insulating dielectric layer covering upper surface of the plurality of semiconductor die stacks to seal up the plurality of semiconductor die stacks to form a semiconductor package structure.

2. The method for packaging a semiconductor according to claim 1, wherein the second surface of the substrate wafer has a plurality of electrically conductive blocks, wherein a given one of the plurality of electrically conductive blocks is electrically connected to a corresponding electrically conductive pillar.

3. The method for packaging a semiconductor according to claim 1, wherein the method of forming a groove on the substrate wafer comprises:
planarizing the first surface of the substrate wafer; and
removing a part of the substrate wafer from the first surface until the electrically conductive pillar is exposed to form the groove.

4. The method for packaging a semiconductor according to claim 3, wherein the substrate wafer has dicing lanes, and the dicing lanes are used for alignment to form the groove.

5. The method for packaging a semiconductor according to claim 1, wherein each of the plurality of semiconductor die stacks is formed by stacking a plurality of semiconductor dies electrically connected to each other, and the bottom of the given semiconductor die stack is electrically connected to the plurality of electrically conductive pillars provided at the bottom of the corresponding groove through a plurality of electrically conductive blocks provided at the bottom of the given groove.

6. The method for packaging a semiconductor according to claim 5, wherein the plurality of semiconductor dies are electrically connected to each other through a plurality of electrically conductive pillars penetrating through each of the plurality of semiconductor dies and a plurality of electrically conductive blocks between the adjacent semiconductor dies.

7. The method for packaging a semiconductor according to claim 1, wherein a thermal expansion coefficient of the substrate wafer is greater than or equal to that of the insulating dielectric layer.

8. The method for packaging a semiconductor according to claim 7, wherein the substrate wafer is a silicon wafer, and the insulating dielectric layer is a silicon dioxide insulating dielectric layer.

9. The method for packaging a semiconductor according to 1, further comprising: covering an upper surface of the insulating dielectric layer and the first surface of the substrate wafer with a cover plate wafer.

10. The method for packaging a semiconductor according to claim 9, wherein a surface of the cover plate wafer facing toward the substrate wafer has a plurality of electrically conductive pillars, and a given one of the plurality of electrically conductive pillars of the cover plate is electrically connected to the upper surface of the corresponding semiconductor die stack through an electrically conductive structure in the insulating dielectric layer.

11. The method for packaging a semiconductor according to claim 1, wherein after sealing up the semiconductor die stack, the method further comprises dicing the semiconductor package structure along the gap between the grooves to form a plurality of packages independent of each other.

12. A semiconductor package structure, comprising:
a substrate wafer having a first surface and a second surface arranged opposite to each other, the first surface having a plurality of grooves, wherein a plurality of electrically conductive pillars are provided at a bottom of a given one of the plurality of grooves, and the plurality of electrically conductive pillars penetrate through the bottom of the given groove to the second surface of the substrate wafer;
a plurality of semiconductor die stacks placed in the plurality of grooves such that a given one of the plurality of semiconductor die stacks is provided in a corresponding one of the plurality of grooves, wherein an upper surface of the given semiconductor die stack is lower than or flush with an upper edge of the corresponding groove, and a bottom of the given semiconductor die stack is electrically connected to the plurality of electrically conductive pillars provided at the bottom of the corresponding groove; and
an insulating dielectric layer filling gaps among sidewalls of the plurality of grooves and the plurality of semiconductor die stacks, the insulating dielectric layer being covering the upper surface of the plurality of semiconductor die stacks to seal up the plurality of semiconductor die stacks.

13. The semiconductor package structure according to claim 12, wherein the second surface of the substrate wafer has a plurality of electrically conductive blocks, wherein a given one of the plurality of electrically conductive blocks is electrically connected to a corresponding electrically conductive pillar.

14. The semiconductor package structure according to claim 12, wherein each of the plurality of semiconductor die stacks is formed by stacking a plurality of semiconductor dies electrically connected to each other, and the bottom of the given semiconductor die stack is electrically connected to the plurality of electrically conductive pillars provided at the bottom of the corresponding groove through a plurality of electrically conductive blocks provided at the bottom of the given groove.

15. The semiconductor package structure according to claim 14, wherein the plurality of semiconductor dies are electrically connected to each other through a plurality of electrically conductive pillars penetrating through each of the plurality of semiconductor dies and a plurality of electrically conductive blocks between the adjacent semiconductor dies.

16. The semiconductor package structure according to claim 12, wherein a thermal expansion coefficient of the substrate wafer is greater than or equal to that of the insulating dielectric layer.

17. The semiconductor package structure according to claim 12, wherein the substrate wafer is a silicon wafer, and the insulating dielectric layer is a silicon dioxide insulating dielectric layer.

18. The semiconductor package structure according to 12, wherein an upper surface of the insulating dielectric layer and the first surface of the substrate wafer are covered with a cover plate wafer.

19. The semiconductor package structure according to claim 18, wherein a surface of the cover plate wafer facing toward the substrate wafer has a plurality of electrically conductive pillars, an electrically conductive structure is provided in the insulating dielectric layer, and a given one of the plurality of electrically conductive pillars of the cover plate is electrically connected to the upper surface of the corresponding semiconductor die stack through the electrically conductive structure.

20. A package, comprising:
a substrate having a first surface and a second surface arranged opposite to each other, the first surface having at least one groove, wherein a plurality of electrically conductive pillars are provided at a bottom of a given one of the plurality of grooves, and the plurality of electrically conductive pillars penetrate through the bottom of the given groove to the second surface of the substrate wafer;

at least one semiconductor die stack placed in the given groove, wherein an upper surface of the given semiconductor die stack is lower than or flush with an upper edge of the corresponding groove, and a bottom of the given semiconductor die stack is electrically connected to the plurality of electrically conductive pillars provided at the bottom of the corresponding groove; and an insulating dielectric layer filling gaps among sidewalls of the plurality of grooves and the plurality of semiconductor die stacks, the insulating dielectric layer being covering the upper surface of the plurality of semiconductor die stacks to seal up the plurality of semiconductor die stacks.

* * * * *